(12) United States Patent
Assale et al.

(10) Patent No.: US 11,881,646 B2
(45) Date of Patent: Jan. 23, 2024

(54) FLEXIBLE CONNECTORS FOR EXPANSION BOARD

(71) Applicant: Telefonaktiebolaget LM Ericsson (publ), Stockholm (SE)

(72) Inventors: Marco Assale, Genoa (IT); Claudio D'Incà, Genoa (IT); Sergio Lanzone, Genoa (IT); Mara Cosentino, Genoa (IT); Angelo Rivara, Genoa (IT); Sergio Mosti, Genoa (IT)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 267 days.

(21) Appl. No.: 17/413,245

(22) PCT Filed: Dec. 14, 2018

(86) PCT No.: PCT/EP2018/085080
§ 371 (c)(1),
(2) Date: Jun. 11, 2021

(87) PCT Pub. No.: WO2020/119933
PCT Pub. Date: Jun. 18, 2020

(65) Prior Publication Data
US 2022/0077612 A1 Mar. 10, 2022

(51) Int. Cl.
*H01R 12/72* (2011.01)
*H01R 12/73* (2011.01)
*H05K 3/40* (2006.01)

(52) U.S. Cl.
CPC ......... *H01R 12/721* (2013.01); *H01R 12/727* (2013.01); *H01R 12/732* (2013.01);
(Continued)

(58) Field of Classification Search
CPC .. H01R 12/721; H01R 12/727; H01R 12/732; H01R 2201/06; H05K 2201/09163; H05K 2201/09172; H05K 3/403
(Continued)

(56) References Cited

U.S. PATENT DOCUMENTS 3,221,286 A * 11/1965 Feede ..................... H05K 1/117
333/260
3,609,462 A * 9/1971 De Barros ............. H01R 12/79
361/752
(Continued)

FOREIGN PATENT DOCUMENTS

CN 206742519 U * 12/2017
CN 207612464 U * 7/2018
(Continued)

OTHER PUBLICATIONS

International Search Report and Written Opinion dated Sep. 11, 2019 for International Application No. PCT/EP2018/085080 filed Dec. 14, 2018, consisting of 8-pages.

*Primary Examiner* — Peter G Leigh
(74) *Attorney, Agent, or Firm* — Christopher & Weisberg, P.A.

(57) ABSTRACT

An electronic circuit board including a plurality of electronic components mounted on the electronic circuit board and a plurality of electricity conductive paths for connecting the electronic components. The electronic circuit board further includes a plurality of electric connectors arranged in a bank along an edge of the electronic circuit board, wherein each one of the plurality of electric connectors is formed from the material of the board as a finger projecting outside the electronic circuit board. In line with either edge of each one of the electric connectors the electronic circuit board has a cut forming a gap and projecting into the board.

20 Claims, 4 Drawing Sheets

(52) U.S. Cl.
CPC ......... *H05K 3/403* (2013.01); *H01R 2201/06* (2013.01); *H05K 2201/09163* (2013.01); *H05K 2201/09172* (2013.01)

(58) Field of Classification Search
USPC ........................................................ 439/637
See application file for complete search history.

(56) References Cited

U.S. PATENT DOCUMENTS

| | | | | | |
|---|---|---|---|---|---|
| 3,737,833 | A | * | 6/1973 | Jerominek | H01R 31/00 |
| | | | | | 439/493 |
| 4,188,714 | A | * | 2/1980 | Jean | H05K 1/118 |
| | | | | | 439/492 |
| 5,383,095 | A | * | 1/1995 | Korsunsky | H05K 3/3405 |
| | | | | | 439/62 |
| 5,949,657 | A | * | 9/1999 | Karabatsos | H05K 1/148 |
| | | | | | 361/744 |
| 6,527,588 | B2 | * | 3/2003 | Paagman | H01R 13/6585 |
| | | | | | 439/607.11 |
| 6,544,045 | B1 | * | 4/2003 | Paagman | H01R 12/58 |
| | | | | | 439/79 |
| 6,697,259 | B1 | * | 2/2004 | Nakamura | H05K 1/141 |
| | | | | | 361/752 |
| 6,801,436 | B2 | * | 10/2004 | Pearson | H05K 3/3405 |
| | | | | | 361/740 |
| 6,917,524 | B2 | * | 7/2005 | Pearson | H05K 1/142 |
| | | | | | 361/740 |
| 6,926,561 | B1 | * | 8/2005 | Handforth | H05K 1/117 |
| | | | | | 439/632 |
| 7,203,074 | B1 | * | 4/2007 | Yaung | H05K 1/142 |
| | | | | | 361/740 |
| 9,095,069 | B2 | * | 7/2015 | Stefanoff | H05K 1/142 |
| 9,780,471 | B2 | * | 10/2017 | Van Rijswijk | H05K 3/366 |
| 2002/0080590 | A1 | * | 6/2002 | Bauermeister | H05K 1/142 |
| | | | | | 361/803 |
| 2003/0013013 | A1 | | 1/2003 | Nakamura | |
| 2004/0214466 | A1 | * | 10/2004 | Lin | H01R 12/721 |
| | | | | | 439/325 |
| 2005/0014419 | A1 | * | 1/2005 | Pearson | H05K 3/3405 |
| | | | | | 439/717 |
| 2012/0073864 | A1 | | 3/2012 | Stefanoff et al. | |
| 2015/0099398 | A1 | * | 4/2015 | Benoliel | H01R 13/6683 |
| | | | | | 29/842 |
| 2016/0309591 | A1 | * | 10/2016 | Mackey | H05K 3/32 |
| 2018/0168040 | A1 | | 6/2018 | Raja et al. | |

FOREIGN PATENT DOCUMENTS

WO WO-2015177060 A1 * 11/2015 ......... H01R 12/7023
WO 2016157165 A1 10/2016

* cited by examiner

FLEXIBLE CONNECTORS FOR EXPANSION BOARD

CROSS-REFERENCE TO RELATED APPLICATIONS

This application is a Submission Under 35 U.S.C. § 371 for U.S. National Stage Patent Application of International Application Number: PCT/EP2018/085080, filed Dec. 14, 2018 entitled "FLEXIBLE CONNECTORS FOR EXPANSION BOARD," the entirety of which is incorporated herein by reference.

TECHNICAL FIELD

The present invention relates to connecting expansion boards, in general, and in particular to connecting high rate interfaces on expansion boards of telecommunications equipment.

BACKGROUND

Adding new functionality to electronic equipment often requires installation of expansion board. Adding expansion board is also often needed to increase processing capacity of the electronic equipment. For example, increase data traffic throughput of a network node there may be a need to install another network interface card. Similarly, expansion board may be needed to add new functionality or increase capacity of a wireless communication equipment.

One method known in the art for connecting a network element (i.e. Equipment A—host board), collecting traffic on the client side and multiplexing it on 4×100G interfaces, to an expansion system (i.e. Equipment B) able to collect 4×100G traffic from the client side and multiplex it in a single 400G interface on the line side is shown in FIG. 1. In this solution individual cables are used to connect to connect four 100G interfaces to their peers on the other board (equipment). When a host system operates plurality of high rate interfaces then their individual connectors to corresponding interfaces at the expansion board require shielding to eliminate interference. When these elements are installed (connected) the available space for a field engineer to make these connections is limited and in consequence the operation is difficult. Using longer cables would help with the installation but considering the high rate of the signals long cables would have detrimental effect on the quality of the signals. Using optical cables is possible but expensive as it requires electrical to optical converters at both ends. Additionally, optical cables would take space as minimum bend radius must be observed in order to prevent damage of the optical fibre.

SUMMARY

It is the object of the present invention to obviate at least some of the above disadvantages and provide an improved electronic circuit board with a bank of electric connectors.

According to an aspect of the present invention there is provided an electronic circuit board comprising a plurality of electronic components mounted on said electronic circuit board and plurality of electricity conductive paths for connecting said electronic components. The electronic circuit board further comprises a plurality of electric connectors arranged in a bank along an edge of the electronic circuit board, wherein each one of the plurality of electric connectors is formed from the material of the board as a finger projecting outside the electronic circuit board. In line with either edge of each one of said electric connectors the electronic circuit board comprises a cut forming a gap and projecting into said board.

Further features of the present invention are as claimed in the dependent claims.

The present invention provides the benefit of compensating for inaccuracy of mounting connector receptacles on a host board allowed by tolerance requirements in devices where multiple receptacles are mounted in a bank on the host board and a plurality of electric connectors must be precisely inserted into these receptacles. Additionally, the present solution requires less space compared with known solutions and uses much shorter connections, which in turn reduces negative impact of interference.

BRIEF DESCRIPTION OF THE DRAWINGS

The present invention will be understood and appreciated more fully from the following detailed description taken in conjunction with the drawings in which.

DETAILED DESCRIPTION

In the following description, for purposes of explanation and not limitation, specific details are set forth such as particular architectures, interfaces, techniques, etc. in order to provide a thorough understanding of the invention. However, it will be apparent to those skilled in the art that the invention may be practiced in other embodiments that depart from these specific details. In other instances, detailed descriptions of well-known devices, circuits, and methods are omitted so as not to obscure the description of the invention with unnecessary details.

Reference throughout the specification to "one embodiment" or "an embodiment" means that a particular feature, structure, or characteristic described in connection with an embodiment is included in at least one embodiment of the present invention. Thus, the appearance of the phrases "in one embodiment" or "in an embodiment" in various places throughout the specification are not necessarily all referring to the same embodiment. Further, the particular features, structures or characteristics may be combined in any suitable manner in one or more embodiments.

Figure 1:
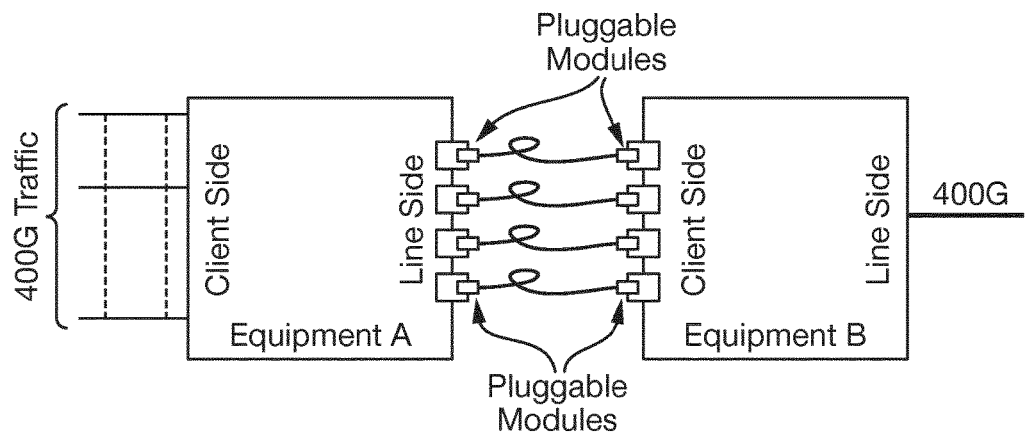
FIG. 1 is a diagram illustrating connecting a host board to an expansion board using a solution known in the art.
Figure 2:
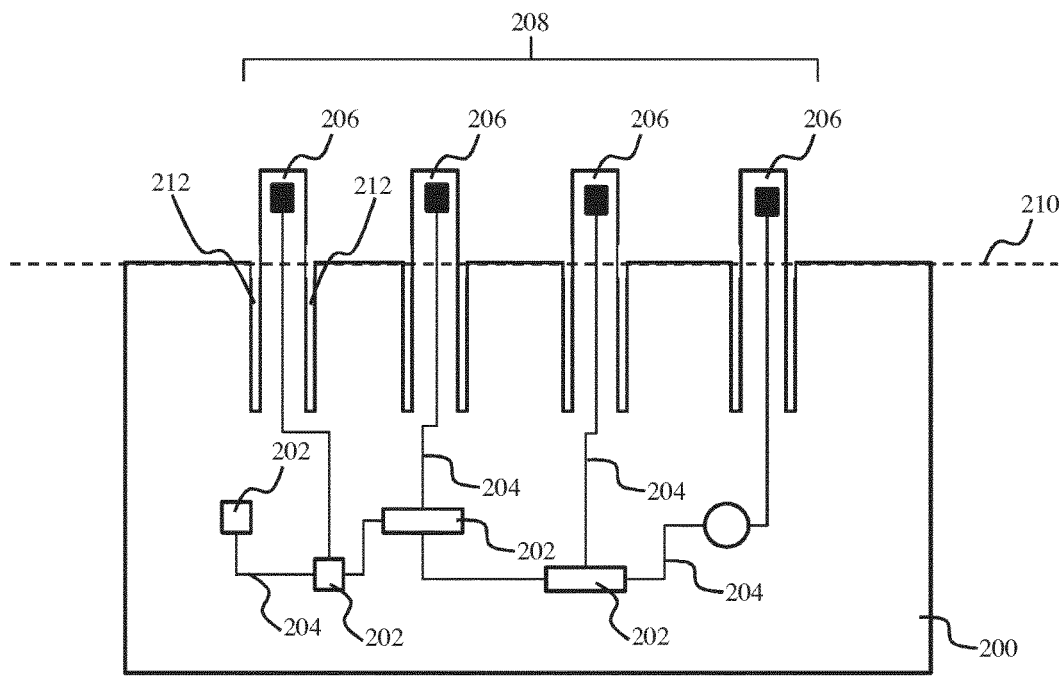
FIG. 2 is a diagram illustrating an electronic circuit board in one embodiment of the present invention.

With reference to FIG. 2 one embodiment of an electronic circuit board, 200, for connecting to a host electronic circuit board is illustrated. The electronic circuit board, 200, comprise a plurality of electronic components, 202, mounted on said electronic circuit board, 200, and plurality of electricity conductive paths, 204, for connecting said electronic components. The electronic circuit, 200, board further comprises a plurality of electric connectors, 206, arranged in a bank, 208, along an edge, 210, of the electronic circuit board, 200. Each one of the plurality of electric connectors, 206, is formed from the material of the board, 200, as a finger projecting outside of the edge, 210, of the electronic circuit board, 200. In line with either edge of each one of said electric connectors, 206, the electronic circuit board, 200, comprises a cut, 212, forming a gap and projecting into said board, 200.

Making the electric connectors from the material of the board and integral with the board the length of electrical path on the connector, 206, will be much shorter than in the prior art solutions with cable connectors and there will be no need for electrical to optical converters to be used only for connecting an expansion board to a host board. Additionally, in telecommunication devices operating at high bit rates (e.g. the multiplexing of 4×100G interfaces) the electric connectors will be pushed into corresponding receptacles on the host board and the connection will be electrically shielded by cages of the receptacles.

Figure 3:
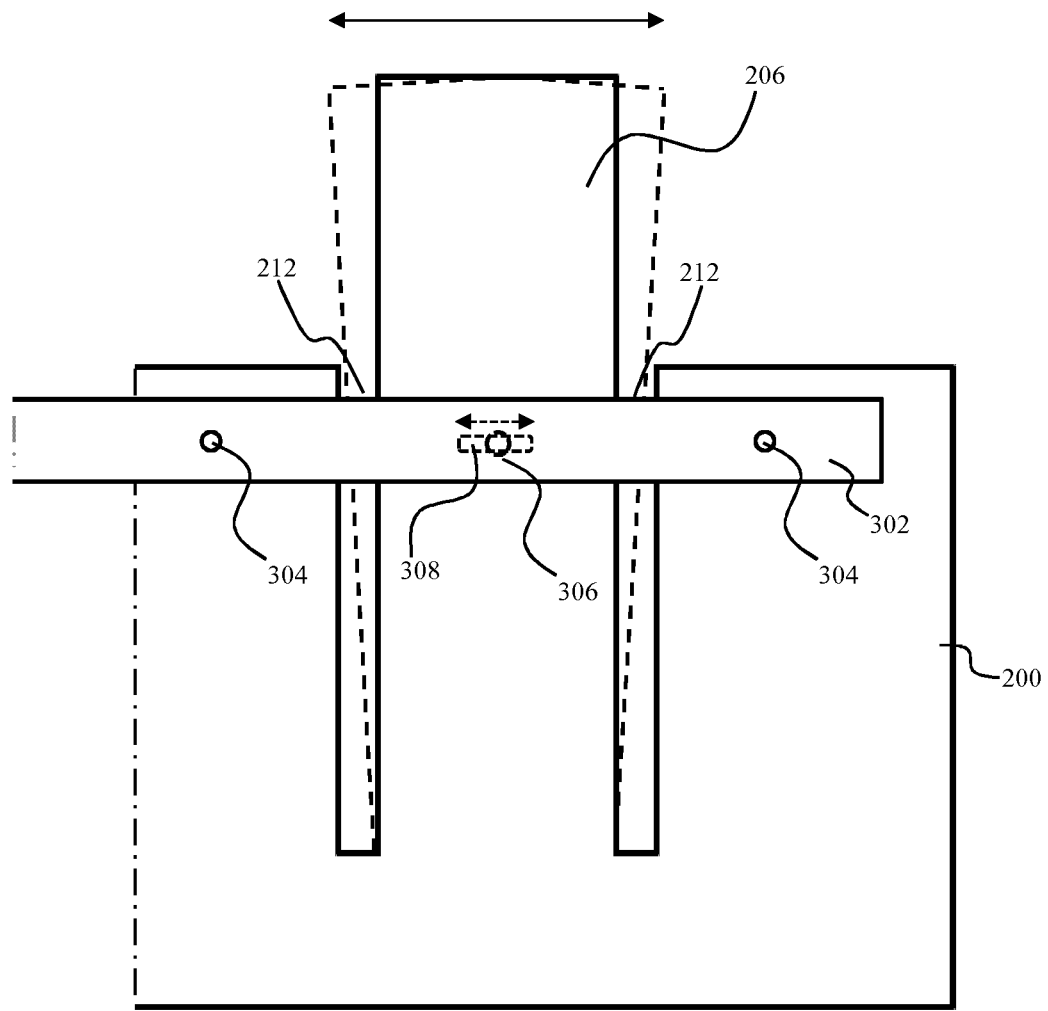
FIG. 3 to FIG. 6 are diagrams illustrating alternative embodiments of the electronic circuit board illustrated in FIG. 2.

The cuts, 212, projecting into the electronic circuit board, 200, define the shape and length of the finger that forms the electric connector, 206, and also allow the finger to flex in the plane of the board, 200, as illustrated in FIG. 3. FIG. 3 is not drawn to scale, the main purpose of this figure is to illustrate that the cuts allow for exploiting flexibility of the material of the electronic circuit board, 200.

The advantage that can be attributed to the cuts allowing for the fingers to flex is that the host board has the receptacles for the connectors, 206, mounted with certain tolerance. Flexibility of the fingers compensate for misalignment between the connectors and their corresponding receptacles.

In a preferred embodiment the width of the cut corresponds to tolerance of mounting of receptacles to which the electric connectors are to be inserted during installation and tolerance of machining of the fingers. To cover the worst-case scenario of misalignment the width of the gap may be equal to the sum of the absolute value of the tolerance for mounting of the receptacles and machining of the fingers. For example, if the tolerance for mounting of the receptacles is 0.7 mm and tolerance of machining of the finger is 0.3 mm then the width of the gap would be 1 mm.

The advantage of having the width of the gap limited is that in addition to allowing the finger to flex in the plane of the electronic circuit board, 200, the gap limits the displacement of the finger and in this way prevents breaking. This is clearly shown in FIG. 3.

As shown in FIG. 3, preferably, the electronic circuit board, 200, may comprise a bar, 302, mounted on said board, 200, along the edge, 210, of the board where the electric connectors are located. The bar, 302, protects the finger from breaking when flexing in the direction perpendicular to the plane of the board, 200. In one embodiment there may be one bar, 302, across all fingers in the board. Alternatively, there may be more bars, for example one bar per finger. The bar, 302, may be mounted to the board using glue or rivets or screws through mounting holes, 304.

In certain implementations a bar or multiple bars, 302, mounted on one side of the electronic circuit board, 200, provide adequate protection against breaking off a finger (or fingers). For example, when the receptacle comprises a guide that limits movement of a finger when a connector, 206, is inserted. In a preferred embodiment, if the bar 302 is mounted only on one side of the electronic circuit board, 200, the protection against breaking off a finger (or fingers) may be achieved by providing a rectangular or oval slot, 308, in the bar, 302, above the finger and mounting a fastener, 306, like a screw or rivet, attached to the finger through the slot, 308, wherein the head of the fastener, 306, is wider than the slot, 308. The fastener, 306, is securely connected to the finger, but does not fix the bar, 302 to the board 200. In this way the finger with the connector, 206, may move sideways within the limits set by the width of the cuts 212, but the head of the fastener, 306, protects it against breaking off.

Alternatively, the electronic circuit board, 200, may comprise at least one bar mounted on the opposite side of said board, 200, along the edge, 210, of the board where the electric connectors, 206, are located.

Figure 4:
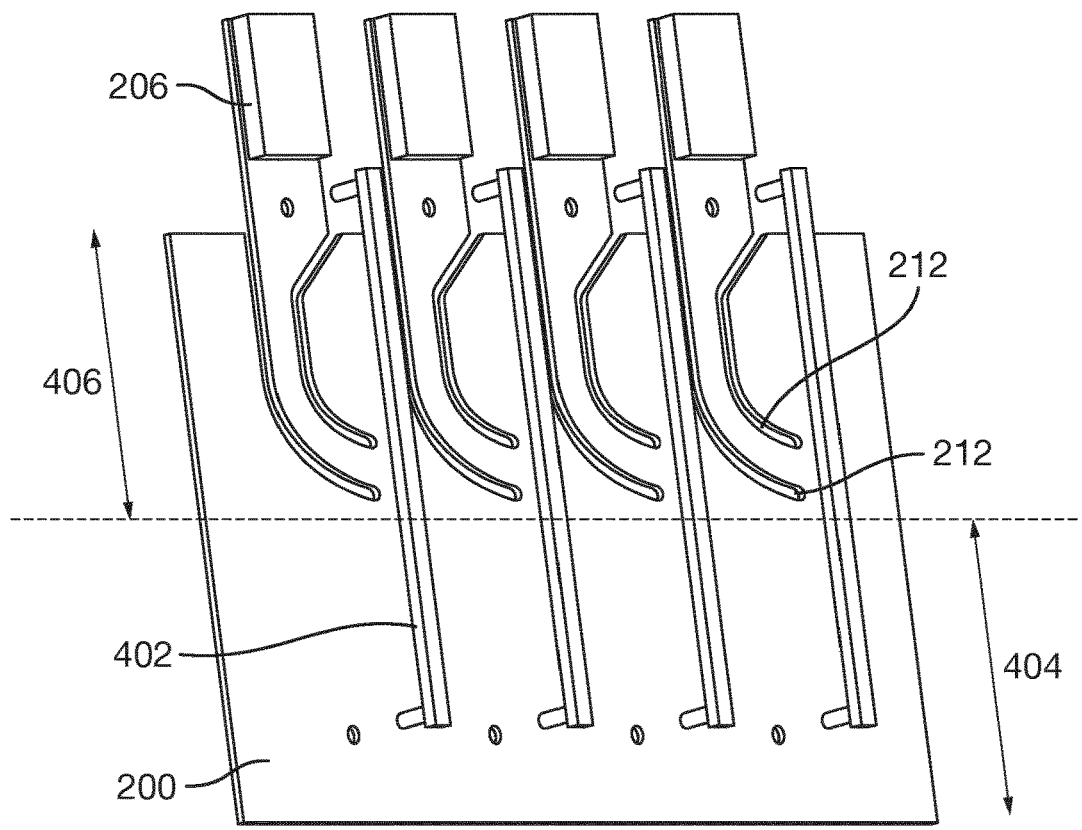

In yet another alternative embodiment, illustrated in FIG. 4, the electronic circuit board, 200, comprises a bar, 402, mounted on the board, 200 in such a way that one end of the bar, 402, is fixed to the board, 200, beyond the area defined by the cuts, 404, and the opposite end of the bar, 402, is located between two cuts associated with one electric connector, 206. The opposite end of the bar, 402, located between the two cuts is preferably not fixed to the material of the finger. In this way the finger may flex in the plane of the board 200. The opposite end of the bar, 402, may be in contact with the finger or alternatively a gap may be formed between the bar and the finger. The gap lets the finger to flex in a direction perpendicular to the plane of the board, 200. In this embodiment a single bar, 402, protects against breaking off a single finger.

In the embodiment illustrated in FIG. 4 the bar, 402, is fixed to the board, 200, beyond the area, 404, defined by the cuts, 212, and it is also fixed to the board, 200, at the finger it protects. In this embodiment the bar, 402, makes the finger more rigid, but also allows the finger to pivot about the point where the bar, 402, is fixed to the finger.

Figure 5:
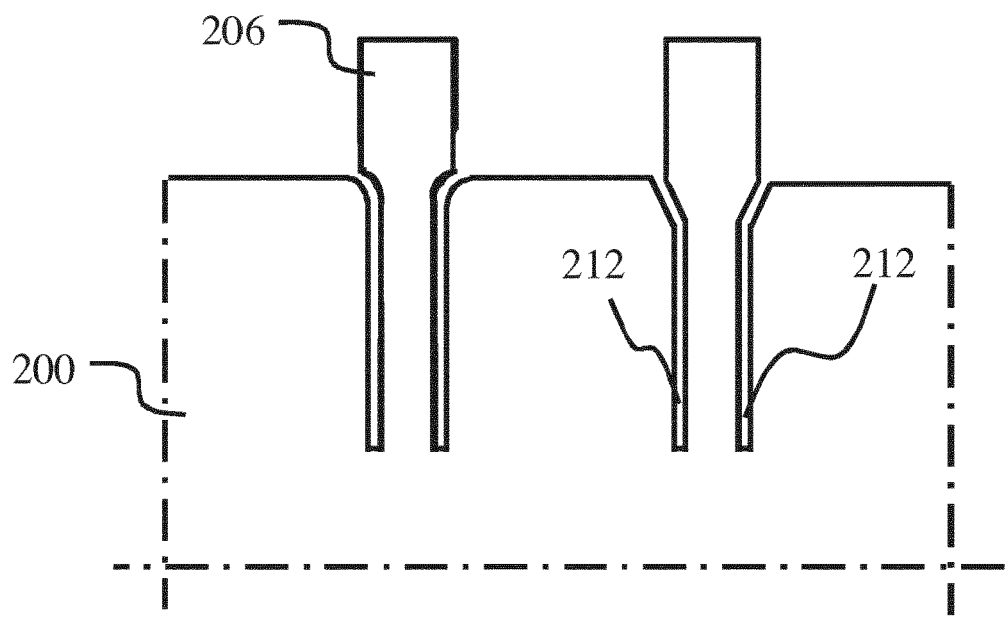

In on embodiment the part of the board located between two cuts associated with a single electric connector is narrower than said electric connector. This embodiment is illustrated in FIG. 5, where two variants of this embodiment are shown. Other shapes in which the area of the finger formed by the cuts is narrower than the width of the connector 206 can be envisaged. The advantage of having the finger in the area formed by the cuts narrower than the connector is that the finger will be more flexible, and the cuts do not have to go as deep into the board as they would have in case the finger is shaped as a rectangle. This, in turn, means that smaller area of the board is taken by the cuts and more area of the board is available for mounting of electronic components, 202. The cuts, 212, enable compensating to mechanical tolerance of forming the connectors and their respective receptacles, but at the same time break integrity of the board, which adds additional constraint when planning the electrical connections between the electronic components. By making the fingers narrower we achieve required flexibility with shorter cuts and in consequence more surface area of the board is left for mounting the electronic components, 202.

In alternative embodiment the two cuts, 212, associated with a single electric connector are formed as substantially equidistant curves. This embodiment is illustrated in FIG. 4. When the cuts, 212, curve they do not go as deep into the board, 200, compared to cuts perpendicular to the edge, 210, of the board. This way more surface area of the board is available for surface mounting of the electronic components, marked as 404, and less surface area of the board is taken by the cuts, marked as 406.

Figure 6:
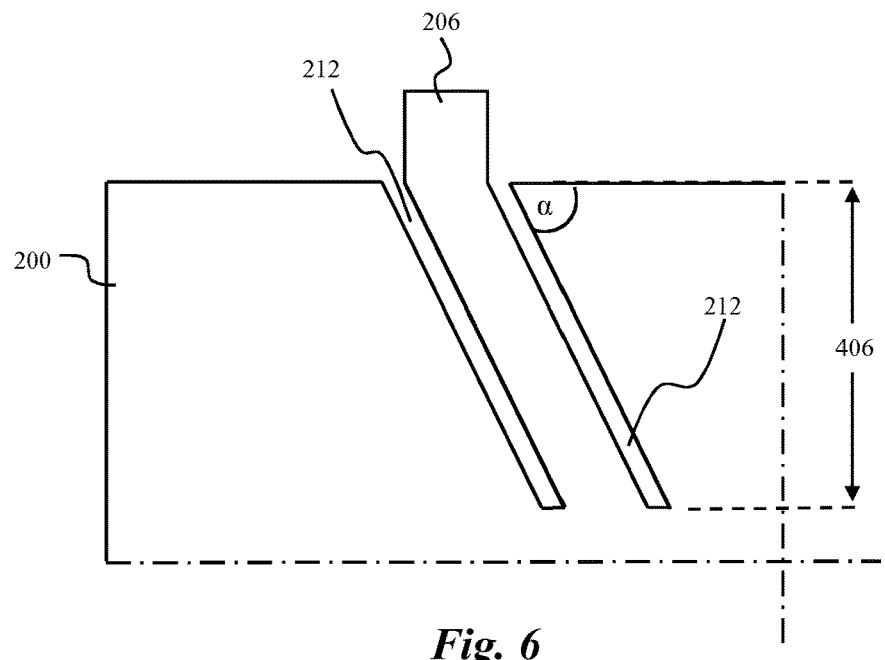

In yet another alternative embodiment the two cuts, 212, associated with a single electric connector are formed at an acute angle α to the edge, 210, of the electronic circuit board, 200, where the electric connectors are located. This embodiment is illustrated in FIG. 6. The advantage of this solution is the same as those embodiments illustrated in FIGS. 4 and 5 and described above—the cuts do not go as deep into the board as cuts perpendicular to the edge of the board and more surface area of the board is available for surface mounting of the electronic components.

Figure 7:
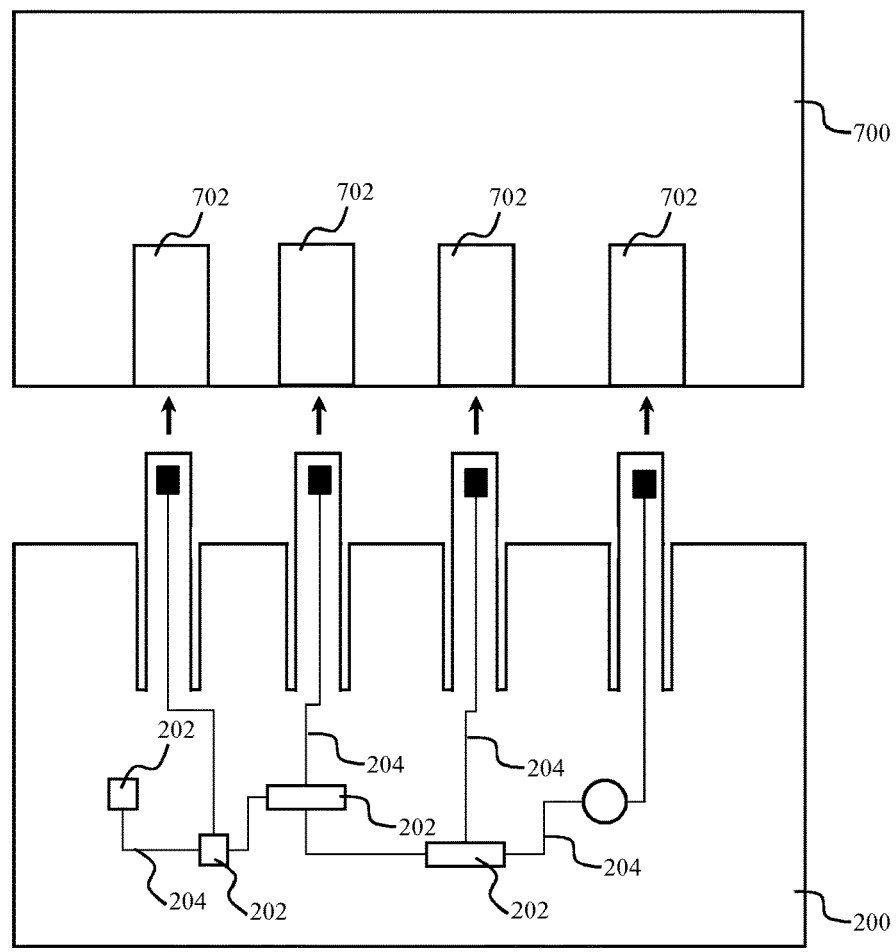
FIG. 7 illustrates an electronic circuit board in one embodiment of the present invention being connected to a host board.

FIG. 7 illustrates the electronic circuit board, 200, operating as an expansion board to a host board, 700, in the process of connecting it to said host board, 700. The host board, 700, is illustrated in a simplified view with only the receptacles, 702, shown. Of course, multiple electronic, optical and/or optoelectronic modules may be mounted on the host board, 700. It is important to note that an expansion board based on embodiments of this invention allows to maintain the receptacles, 702, at the host board, 700, which means that not only expansion boards implementing connectors according to embodiments of the present invention may be connected, but also other devices may be connected to the host board, 700. Further, using separate receptacles (which typically are in a form of metallic cages) for individual interfaces isolates the interfaces by shielding them from one another. This is highly beneficial for high bitrate interfaces as it reduces interference. The solutions disclosed in this document are particularly suitable for use in electronic circuit boards (expansion boards) for use in radio network nodes or optical network nodes.

It should be noted that the above-mentioned examples illustrate rather than limit the disclosure, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. An electronic circuit board comprising:
   a plurality of electronic components mounted on the electronic circuit board;
   a plurality of electricity conductive paths for connecting the electronic components;
   a plurality of electric connectors arranged in a bank along an edge of the electronic circuit board, each one of the plurality of electric connectors being formed from the material of the board as a finger projecting outside the electronic circuit board; and
   in line with either edge of each one of the electric connectors a cut forming a gap and projecting into the board.

2. The electronic circuit board according to claim 1, wherein a part of the electronic circuit board located between two cuts associated with a single electric connector is narrower than the single electric connector.

3. The electronic circuit board according to claim 2, wherein the width of the cut corresponds to tolerance of mounting of receptacles to which the electric connectors are to be inserted during installation and tolerance of machining of the fingers.

4. The electronic circuit board according to claim 3, wherein two cuts associated with a single electric connector are formed as substantially equidistant curves.

5. The electronic circuit board according to claim 2, wherein two cuts associated with a single electric connector are formed as substantially equidistant curves.

6. The electronic circuit board according to claim 2, wherein two cuts associated with a single electric connector are formed at an acute angle to the edge of the electronic circuit board where the electric connectors are located.

7. The electronic circuit board according to claim 2, comprising at least one bar mounted on the board along the edge of the board where the electric connectors are located.

8. The electronic circuit board according to claim 2, comprising at least one bar mounted on the board for each one of the electric connectors wherein one end of the bar is fixed to the board beyond the area defined by the cuts and the opposite end of the bar is located between two cuts associated with one electric connector.

9. The electronic circuit board according to claim 1, wherein the width of the cut corresponds to tolerance of mounting of receptacles to which the electric connectors are to be inserted during installation and tolerance of machining of the fingers.

10. The electronic circuit board according to claim 9, wherein two cuts associated with a single electric connector are formed at an acute angle to the edge of the electronic circuit board where the electric connectors are located.

11. The electronic circuit board according to claim 9, comprising at least one bar mounted on the board along the edge of the board where the electric connectors are located.

12. The electronic circuit board according to claim 9, comprising at least one bar mounted on the board for each one of the electric connectors wherein one end of the bar is fixed to the board beyond the area defined by the cuts and the opposite end of the bar is located between two cuts associated with one electric connector.

13. The electronic circuit board according to claim 1, wherein two cuts associated with a single electric connector are formed as substantially equidistant curves.

14. The electronic circuit board according to claim 13, comprising at least one bar mounted on the board along the edge of the board where the electric connectors are located.

15. The electronic circuit board according to claim 13, comprising at least one bar mounted on the board for each one of the electric connectors wherein one end of the bar is fixed to the board beyond the area defined by the cuts and the opposite end of the bar is located between two cuts associated with one electric connector.

16. The electronic circuit board according to claim 1, wherein two cuts associated with a single electric connector are formed at an acute angle to the edge of the electronic circuit board where the electric connectors are located.

17. The electronic circuit board according to claim 16, comprising at least one bar mounted on the opposite side of the board along said edge of the board where the electric connectors are located.

18. The electronic circuit board according to claim 16, comprising at least one bar mounted on the board along the edge of the board where the electric connectors are located.

19. The electronic circuit board according to claim 1, comprising at least one bar mounted on the board along the edge of the board where the electric connectors are located.

20. The electronic circuit board according to claim 1, comprising at least one bar mounted on the board for each one of the electric connectors wherein one end of the bar is fixed to the board beyond the area defined by the cuts and the opposite end of the bar is located between two cuts associated with one electric connector.

* * * * *